(12) United States Patent
Kuechenmeister et al.

(10) Patent No.: US 7,585,759 B2
(45) Date of Patent: Sep. 8, 2009

(54) TECHNIQUE FOR EFFICIENTLY PATTERNING AN UNDERBUMP METALLIZATION LAYER USING A DRY ETCH PROCESS

(75) Inventors: Frank Kuechenmeister, Dresden (DE); Alexander Platz, Moritzburg (DE); Gotthard Jungnickel, Radeberg (DE); Kerstin Siury, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 298 days.

(21) Appl. No.: 11/382,135

(22) Filed: May 8, 2006

(65) Prior Publication Data

US 2007/0023928 A1 Feb. 1, 2007

(30) Foreign Application Priority Data

Jul. 29, 2005 (DE) .................... 10 2005 035 772

(51) Int. Cl.
 *H01L 21/44* (2006.01)
(52) U.S. Cl. ................. 438/614; 216/13; 257/E21.508
(58) Field of Classification Search ......... 438/612–614, 438/617; 257/781, E21.508, E23.021; 216/13, 216/108, 95
 See application file for complete search history.

(56) References Cited

U.S. PATENT DOCUMENTS

| 5,268,072 | A | * | 12/1993 | Agarwala et al. ............. 216/13 |
| 5,486,282 | A | * | 1/1996 | Datta et al. .................. 205/123 |
| 5,629,564 | A | | 5/1997 | Nye, III et al. ............... 257/762 |
| 5,907,790 | A | * | 5/1999 | Kellam ........................ 438/666 |
| 5,937,320 | A | * | 8/1999 | Andricacos et al. ......... 438/614 |
| 6,293,457 | B1 | * | 9/2001 | Srivastava et al. ........... 228/254 |
| 2002/0111010 | A1 | * | 8/2002 | Walker et al. ................ 438/614 |
| 2003/0155408 | A1 | * | 8/2003 | Fanti et al. ................... 228/215 |
| 2003/0157791 | A1 | | 8/2003 | Tong et al. ................... 438/613 |
| 2003/0166330 | A1 | | 9/2003 | Tong et al. ................... 438/612 |
| 2004/0013804 | A1 | | 1/2004 | Chen et al. ................... 427/304 |
| 2004/0175657 | A1 | | 9/2004 | Danovitch et al. .......... 430/311 |

(Continued)

FOREIGN PATENT DOCUMENTS

GB 1029673 5/1966

(Continued)

OTHER PUBLICATIONS

Quirk., M, Semiconductor Manufacturing technology, Prentice Hall, 2001, pp. 455 & 468.*

(Continued)

*Primary Examiner*—W. David Coleman
*Assistant Examiner*—Latanya Crawford
(74) *Attorney, Agent, or Firm*—Williams, Morgan & Amerson, P.C.

(57) ABSTRACT

By patterning the underbump metallization layer stack on the basis of a dry etch process, significant advantages may be achieved compared to conventional techniques involving a highly complex wet chemical etch process. In particular embodiments, a titanium tungsten layer or any other appropriate last layer of an underbump metallization layer stack may be etched on the basis of a plasma etch process using a fluorine-based chemistry and oxygen as a physical component. Moreover, appropriate cleaning processes may be performed for removing particles and residues prior to and after the plasma-based patterning process.

29 Claims, 4 Drawing Sheets

U.S. PATENT DOCUMENTS

| | | | |
|---|---|---|---|
| 2004/0209406 A1* | 10/2004 | Jan et al. | 438/148 |
| 2004/0235299 A1* | 11/2004 | Srivastava et al. | 438/689 |
| 2005/0026450 A1* | 2/2005 | Cooper et al. | 438/745 |
| 2005/0062170 A1* | 3/2005 | Biggs et al. | 257/780 |
| 2005/0224966 A1* | 10/2005 | Fogel et al. | 257/737 |
| 2006/0016861 A1* | 1/2006 | Daubenspeck et al. | 228/180.21 |
| 2006/0057829 A1* | 3/2006 | Wu et al. | 438/597 |
| 2006/0172444 A1* | 8/2006 | Jungnickel et al. | 438/14 |
| 2006/0231948 A1* | 10/2006 | Lin et al. | 257/737 |

FOREIGN PATENT DOCUMENTS

| | | |
|---|---|---|
| JP | 10-41283 | 2/1988 |
| WO | WO 2005/062367 A1 | 11/2003 |

OTHER PUBLICATIONS

International Search Report Dated Jan. 5, 2007.

Widmann, D., et al.; "Technologie Hochintegrierter Schaltungen" Springer 1996.

* cited by examiner

TECHNIQUE FOR EFFICIENTLY PATTERNING AN UNDERBUMP METALLIZATION LAYER USING A DRY ETCH PROCESS

BACKGROUND OF THE INVENTION

1. Field of the Invention

The present invention generally relates to the formation of integrated circuits, and, more particularly, to a process flow for forming a contact layer including bumps, wherein the contact layer is configured to provide contact areas for directly attaching an appropriately formed package or carrier substrate to a die carrying one or more integrated circuits.

2. Description of the Related Art

In manufacturing integrated circuits, it is usually necessary to package a chip and provide leads and terminals for connecting the chip circuitry with the periphery. In some packaging techniques, chips, chip packages or other appropriate units may be connected by means of solder balls, formed from so-called solder bumps, that are formed on a corresponding layer, which will be referred to herein as a contact layer, of at least one of the units, for instance on a dielectric passivation layer of the microelectronic chip. In order to connect the microelectronic chip with the corresponding carrier, the surfaces of two respective units to be connected, i.e., the microelectronic chip comprising, for instance, a plurality of integrated circuits, and a corresponding package having formed thereon adequate pad arrangements to electrically connect the two units after reflowing the solder bumps provided on at least one of the units, for instance on the microelectronic chip. In other techniques, solder bumps may have to be formed that are to be connected to corresponding wires, or the solder bumps may be brought into contact with corresponding pad areas of another substrate acting as a heat sink. Consequently, it may be necessary to form a large number of solder bumps that may be distributed over the entire chip area, thereby providing, for example, the I/O capability required for modern microelectronic chips that usually include complex circuitry, such as microprocessors, storage circuits and the like, and/or include a plurality of integrated circuits forming a complete complex circuit system.

In order to provide hundreds or thousands of mechanically well-fastened solder bumps on corresponding pads, the attachment procedure of the solder bumps requires a careful design since the entire device may be rendered useless upon failure of only one of the solder bumps. For this reason, one or more carefully chosen layers are generally placed between the solder bumps and the underlying substrate or wafer including the pad arrangement. In addition to the important role these interfacial layers, herein also referred to as underbump metallization layer, may play in endowing a sufficient mechanical adhesion of the solder bump to the underlying pad and the surrounding passivation material, the underbump metallization has to meet further requirements with respect to diffusion characteristics and current conductivity. Regarding the former issue, the underbump metallization layer has to provide an adequate diffusion barrier to prevent the solder material, frequently a mixture of lead (Pb) and tin (Sn), from attacking the chip's underlying metallization layers and thereby destroying or negatively affecting their functionality. Moreover, migration of solder material, such as lead, to other sensitive device areas, for instance into the dielectric, where a radioactive decay in lead may also significantly affect the device performance, has to be effectively suppressed by the underbump metallization. Regarding current conductivity, the underbump metallization, which serves as an interconnect between the solder bump and the underlying metallization layer of the chip, has to exhibit a thickness and a specific resistance that does not inappropriately increase the overall resistance of the metallization pad/solder bump system. In addition, the underbump metallization will serve as a current distribution layer during electroplating of the solder bump material. Electroplating is presently the preferred deposition technique, since physical vapor deposition of solder bump material, which is also used in the art, requires a complex mask technology in order to avoid any misalignments due to thermal expansion of the mask while it is contacted by the hot metal vapors. Moreover, it is extremely difficult to remove the metal mask after completion of the deposition process without damaging the solder pads, particularly when large wafers are processed or the pitch between adjacent solder pads decreases.

Although a mask is also used in the electroplating deposition method, this technique differs from the evaporation method in that the mask is created using photolithography to thereby avoid the above-identified problems caused by physical vapor deposition techniques. However, electroplating requires a continuous and uniform current distribution layer adhered to the substrate that is mainly insulative, except for the pads on which the solder bumps have to be formed. Thus, the underbump metallization also has to meet strictly set constraints with respect to a uniform current distribution as any non-uniformities during the plating process may affect the final configuration of the solder bumps and, after reflowing the solder bumps, of the resulting solder balls in terms of, for instance, height non-uniformities, which may in turn translate into fluctuations of the finally obtained electric connections and the mechanical integrity thereof.

After the formation of the solder bumps, the underbump metallization has to be patterned so as to electrically insulate the individual solder bumps from each other. The resulting islands of underbump metallization, typically obtained by highly complex isotropic etch processes including wet chemical and/or electrochemical etch procedures with complex chemistry, also significantly determine the functionality and configuration of the solder balls, since the etch chemistry may result in under-etching of the solder bumps which act as a mask during the wet chemical etch process. Consequently, a varying degree of under-etch may result in a varying size of the resulting underbump metallization islands associated with each solder bump, thereby significantly affecting the configuration of the solder ball after reflow as the highly wettable underbump metallization substantially determines the flow behavior of the solder material and thus the finally obtained size and hence the height of the solder ball. Moreover, the wet chemical etch process for patterning one or more sub-layers of the underbump metallization, such as a titanium tungsten (TiW) layer, which is frequently used as the first layer formed on the dielectric material due to the superior characteristics in view of barrier and adhesion, may exhibit a bump pattern dependent etch rate. That is, the etch rate may depend on the bump layout within each die and the distances in the X-direction and the Y-direction between individual dies on the substrate. Thus, the pattern dependent etch rate may impose severe constraints with respect to the actually usable bump layout, thereby possibly restricting I/O capabilities and/or heat dissipation of the die with respect to the actually available die area.

Furthermore, some wet chemical etch processes tend to significantly interact with the bump material, wherein the bump material may be removed and/or a chemical reaction may convert bump material into a non-desired compound. Hence, after the wet chemical etch process, during the wet chemical process or during a subsequent cleaning process for removing any non-desired compound, a significant amount of the bump material may be lost, which may contribute to increased production cost, especially when expensive solder materials are used, such as tin/lead with a low alpha decay rate.

Moreover, due to the complexity of the wet etch chemistry and the etch recipes, sophisticated endpoint detection procedures may be necessary during the patterning of the underbump metallization, thereby additionally contributing to process complexity. In some cases, the provision of the chemistry and of required additives for the wet chemical processes, as well as the disposal of the wet chemical byproducts, may also add significant costs to the overall patterning process, wherein maintenance and floor space for dedicated process tools may also represent an important cost factor.

In view of the situation described above, there is a need for an improved technique for forming a contact layer including solder bumps, wherein one or more of the problems identified above are avoided or the effects thereof are at least significantly reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for forming a contact layer of a microelectronic chip, which is adapted to be directly attached to a corresponding carrier substrate by reflowing, bumps, such as solder bumps, formed on and in the contact layer, wherein the process for patterning the underbump metallization comprises a dry etch process, thereby offering the potential for avoiding one or more of the problems involved in the wet chemical etch processes that are frequently used in conventional process flows. Moreover, an increased degree of flexibility for designing the contact layer is provided by the inventive technique as the dependence of the patterning process on the pattern density of the bumps is significantly reduced due to the advantages offered by the plasma based dry etch process. Consequently, the present invention provides the potential for saving production costs and/or increasing production yield and/or enhancing device performance.

According to one illustrative embodiment of the present invention, a method comprises patterning a first layer of an underbump metallization layer stack by an electrochemical etch process in the presence of a plurality of bumps that are formed on the underbump metallization layer stack. Moreover, a second layer of the underbump metallization layer stack is patterned by a dry etch process.

According to another illustrative embodiment of the present invention, a method comprises providing a substrate having formed thereon an underbump metallization layer stack with at least a first layer and a second layer and a plurality of bumps formed above the underbump metallization layer stack. Furthermore, the first layer of the underbump metallization layer stack is patterned to expose the second layer and the exposed second layer is then cleaned. Finally, the method comprises dry etching the exposed second layer while using the bumps as an etch mask.

BRIEF DESCRIPTION OF THE DRAWINGS

The invention may be understood by reference to the following description taken in conjunction with the accompanying drawings, in which like reference numerals identify like elements, and in which.

Figure 1A:
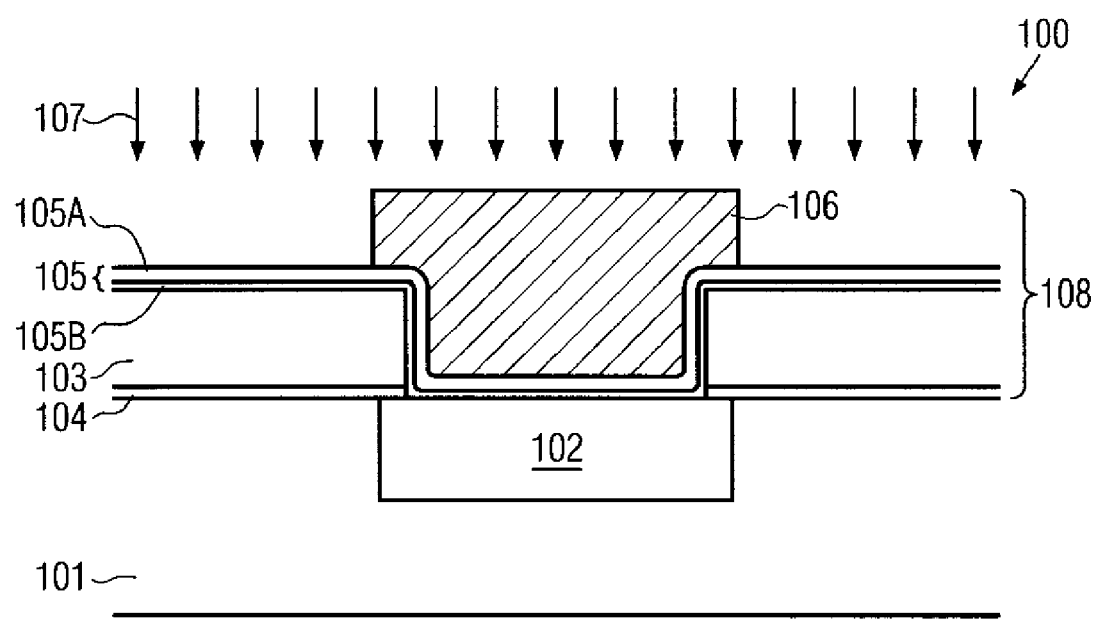
FIGS. 1a-1f schematically show cross-sectional views of a semiconductor device in various manufacturing stages for patterning an underbump metallization layer according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates the formation of a contact layer, that is, the layer in and on which a plurality of bumps, such as solder bumps, are formed for a direct connection to an appropriate carrier substrate, by replacing a complex wet chemical etch process during the patterning of the underbump metallization layer by an appropriately designed dry etch process, thereby enhancing the device performance and reducing manufacturing costs.

With reference to FIGS. 1a-1g, further illustrative embodiments of the present invention will now be described in more detail. FIG. 1a schematically shows a semiconductor device 100 in an advanced manufacturing stage. The semiconductor device 100 comprises a substrate 101, which may represent a bulk silicon substrate, a silicon-on-insulator (SOI) substrate, or any other carrier having formed thereon one or more appropriate semiconductor layers for forming circuit elements therein and thereon. For example, the substrate 101 may represent an appropriate carrier having formed thereon a silicon/germanium layer, silicon layers having different crystalline orientations at specific locations, or the substrate 101 may comprise any type of II-VI or III-V semiconductor compound. In particular embodiments, the substrate 101 may represent a silicon-based substrate as it may be used for the formation of highly complex integrated circuits, such as advanced microprocessors, storage devices, ASICs (application specific ICs), combined digital and analog circuits possibly including circuits for power applications, and the like. For convenience, any such circuit elements or other microstructural features are not shown in FIG. 1a. The substrate 101 may comprise a contact pad 102, which may be formed of any appropriate metal, such as copper, copper alloy, aluminum or any combination thereof. The contact pad 102 is to represent a thermally and electrically conductive region that provides electrical and/or thermal contact to lower-lying device regions within the substrate 101. That is, the semiconductor device 100 may comprise one or more "wiring" layers or metallization layers, which provide the electric and thermal interconnection of individual circuit elements, wherein the contact pad 102 is provided to act as an "interface" between the one or more metallization layers and a carrier substrate that provides the electrical connection to the periphery of the semiconductor device 100.

Formed above the substrate 101 and the contact pad 102 is a contact layer 108 which, in this manufacturing stage, is comprised of a patterned passivation layer 103 that may be formed on a dielectric cover layer 104 of the last metallization layer. The passivation layer 103 and the cover layer 104 may be formed of any appropriate dielectric material, wherein, in one particular embodiment, the passivation layer 103 may be comprised of polyimide, while, in other illustrative embodiments, other dielectric materials such as benzocyclobutene may be used. Formed above the passivation layer 103 is an underbump metallization layer stack 105, which is to be patterned in the presence of a bump 106, such as a solder bump, a bump of a conductive or non-conductive adhesive, and the like. For convenience, the bumps 106 will be referred to as solder bumps, since, in many cases, the bumps 106 are comprised of solder material. Thus, after patterning of the underbump metallization layer stack 105, a plurality of electrically insulated solder bumps 106 formed on respective underbump metallization islands will be provided. The underbump metallization layer stack 105 may be comprised of a plurality of individual layers having a different material composition, wherein the layer stack 105 comprises at least a first layer 105a formed on a second layer 105b which, in turn, is formed at least on the passivation layer 103, the cover layer 104 and an exposed portion of the contact pad 102.

As previously explained, the layer stack 105 may be comprised of a plurality of individual layers to provide the required characteristics in view of adhesion, diffusion barrier effect, thermal and electrical conductivity. Thus, a variety of material compositions including gold, silver, copper, chromium, palladium, platinum, tungsten and the like may be used in various combinations and provided in different compounds, wherein also the individual layer thicknesses are appropriately adapted to the device requirements. In one particular embodiment, the second layer 105b of the underbump metallization layer stack 105 is comprised of a composition of titanium and tungsten, which is frequently selected in view of its superior adhesion and diffusion blocking characteristics. In other illustrative embodiments, the second layer 105b may be comprised of titanium, tantalum, tungsten and any alloys of these metals or any compounds of these metals and alloys thereof with nitrogen and/or silicon. The first layer 105a may be comprised of two or more sub-layers with a material composition that provides the desired effect in combination with the solder material of the bump 106. In sophisticated applications, frequently copper or a copper alloy, such as copper/chromium, may be used as one or more individual layers to provide a high thermal and electrical conductivity, while, in one illustrative embodiment, additionally a substantially pure copper layer may be provided in the layer 105a so as to form a copper/tin phase after reflow of the solder bump 106, when comprising a mixture of lead and tin. It should be appreciated, however, that the first layer 105a may be formed of any other appropriate conductive material, depending on the composition of the solder bump 106 so as to provide the desired thermal and electrical characteristics. For instance, gold and alloys thereof, silver and alloys thereof, platinum and alloys thereof, as well as its compounds with nitrogen and/or silicon, may also be used.

A typical process flow for forming the semiconductor device 100 as shown in FIG. 1a may comprise the following processes. After the formation of any circuit elements and other microstructural features in accordance with well-established process techniques, any metallization layers may be formed to provide the required inter-level and intra-level connection to the respective individual circuit elements. In sophisticated applications, the one or more metallization layers may be formed on the basis of a highly conductive metal, such as copper or copper alloy, embedded in a low-k dielectric material for reducing parasitic capacitances. Next, the contact pad 102 may be formed, for instance as a component of a last metallization layer, in a corresponding dielectric layer on the basis of well-established process techniques wherein, as previously explained, similar process techniques may be used as are well known for the formation of metallization layers. For example, the contact pad 102 may be formed on the basis of well-established damascene techniques when the contact pad 102 is substantially comprised of copper or a copper alloy. Thereafter, a final or terminal metal layer (not shown), such as aluminum, may be formed on top of the copper or copper alloy.

Thereafter, the cover layer 104 may be deposited on the basis of well-established plasma enhanced chemical vapor deposition (PECVD) techniques and may be patterned, followed by the deposition and patterning of the terminal metal. Then, the deposition of the passivation layer 103 may be performed on the basis of spin-on techniques, chemical vapor deposition (CVD) techniques, and the like. Thereafter, the passivation layer 103 may be patterned by using well-established photolithography and etch techniques to form an opening for exposing the contact pad 102. Next, the underbump metallization layer stack 105 may be formed on the basis of well-established sputter deposition techniques. For instance, the second layer 105b may be deposited as a titanium tungsten composition as alloys comprising titanium and tungsten have widely been used as barrier layers to protect chip parts in a variety of applications. Due to the properties of titanium tungsten, i.e., its conduction of electricity and superior barrier qualities with respect to diffusion of, for example, lead (Pb) and tin (Sn) atoms into areas underlying the titanium tungsten layer, it is a viable candidate for the second layer 105b formed on the passivation layer 103. In other embodiments, other materials as explained above may be formed by sputter deposition or any other appropriate deposition techniques, such as CVD.

Thereafter, the first layer 105a may be deposited, for instance on the basis of sputter deposition, electrochemical deposition, such as electroless plating, and the like. For example, the first layer 105a may be comprised of a chromium/copper layer that is formed on the second layer 105b, followed by a substantially pure copper layer. It should be appreciated, however, that any other layer composition and various other materials may be selected for the first layer 105a. After the formation of the underbump metallization layer stack 105, a resist mask (not shown) is formed by applying a photoresist layer and patterning the same by ell-established photolithography and etch techniques to form an opening, the dimensions of which substantially correspond to the size and shape of the solder bump 106.

Thereafter, the substrate 101 is subjected to an electrochemical deposition process to form the solder bump 106 having a specified material composition. For example, an electroplating process on the basis of an electrolyte bath containing lead sulfate and tin sulfate may be used in order to deposit lead and tin in the opening of the resist mask. It should be appreciated that the amount of solder material deposited into the opening in the resist mask substantially determines the finally obtained size of a solder ball so that any removal of this material during the subsequent patterning of the underbump metallization layer stack 105 may negatively affect the uniformity of the finally obtained solder balls due to across-substrate non-uniformities of conventional wet chemical etch processes. Moreover, in sophisticated applications, expensive lead material may be used, which exhibits a reduced number of radioactive isotopes, which may result in non-desired soft errors in sensitive semi-conductor devices, such as storage chips, microprocessors and the like. Consequently, a significant material removal during subsequent wet chemical processes may also contribute to production costs, as the material amount initially provided during the electrochemical deposition of the solder bump 106 may have to be taken into consideration in conventional techniques. As will be explained below, the patterning process, especially of the second layer 105b, by plasma-based dry etch techniques in accordance with the present invention, may significantly relax any constraints imposed by any material loss of the solder bumps 106 in conventional patterning schemes.

After the deposition of the solder bump 106, the resist mask is removed and the device 100 is subjected to a patterning process 107, which in one illustrative embodiment is configured as an electrochemical removal process for patterning the first layer 105a in the presence of the solder bump 106. For example, the first layer 105a, which may comprise two or more sub-layers, may be formed of copper, chromium or any composition thereof, for which well-approved electrochemical etch processes are known in the art. For this purpose, the device 100 may be brought into contact with an appropriate electrolyte solution including, in addition to other ingredients and additives, corresponding metal sulfate ions of the first layer 105a in order to establish a current flow between the exposed portions of the first layer 105a, acting as an anode, to a cathode (not shown) while material removal of the solder bump 106 is substantially avoided, as this metal is less noble than the metal of the first layer 105a. In other embodiments, the patterning process 107 may be performed as a wet chemical etch process on the basis of appropriate etch chemistries. In still other embodiments, the patterning process 107 may include plasma-based etch processes, performed with a chemistry appropriate for removing the material or materials of the first layer 105a.

Figure 1B:
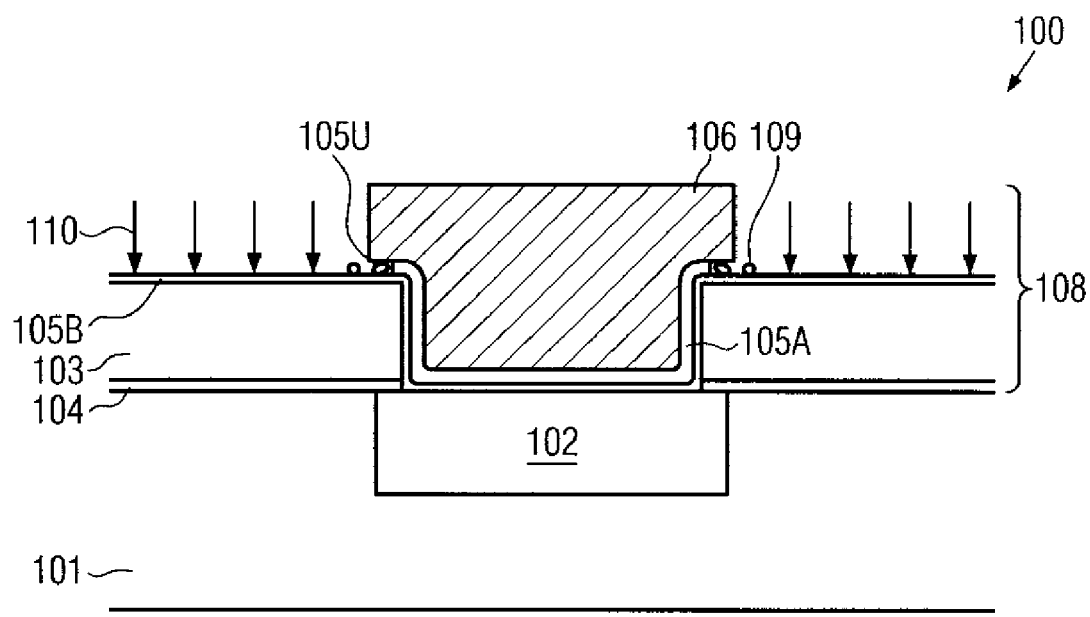

FIG. 1b schematically shows the semiconductor device 100 in a manufacturing stage in which the patterning process 107 may have removed significant portions of the first layer 105a from exposed portions of the device 100, wherein, depending on the process 107, respective under-etch areas 105u may have formed as a gap between the second layer 105b and the solder bump 106 at the perimeter thereof. Moreover, during the patterning process 107, contaminations in the form of particles and the like may form or deposit on the layer 105a and/or 105b, depending on the progress of the patterning process 107. As is shown in FIG. 1b, the exposed portions of the first layer 105a are substantially removed, while particles 109 may have formed or may have been deposited on portions of the exposed second layer 105b. The particles 109, which may for instance be comprised of lead or tin and which may typically remain on the second layer 105b after completion of the patterning of the first layer 105a, may result in a shadowing effect in the subsequent dry etch process. Since the removal of these particles 109 may not be efficiently accomplished in the plasma-based etch chemistry of the subsequent dry etch patterning process for patterning the second layer 105b, an additional cleaning process 110 is performed to remove the particles 109 or at least significantly reduce the number thereof. Otherwise, the insulating distance between neighboring solder bumps 106 may be reduced, thereby increasing the probability of bump shortages and functional failure of the device 100. Moreover, the particles 109 may adversely affect the adhesion of any underfill material to the passivation layer 103, when the device 100 is attached to a corresponding carrier substrate on the basis of the solder bumps 106 and the remaining spaces are substantially filled with the underfill material. A reduced adhesion of the respective underfill material to the underlying passivation layer 103 may, however, result in fatigue cracks of the solder bumps 106 and therefore result in functional failures of the device 100. Moreover, as may be seen in FIG. 1b, the under-etch areas 105u may have been formed during the patterning process 107, due to the isotropic nature of, for instance, an electrochemical etch process, so that any residues, such as the particles 109 on the second layer 105b in this gap, may act as an additional wetting area for the solder bump material during the reflow process when the bump 106 is formed into a corresponding solder ball, wherein the first layer 105a, i.e., the non-removed portion thereof, acts as a wetting layer that substantially determines the final dimensions of the solder ball to be formed. Thus, any residues in the under-etch areas 105u may lead to a non-uniformity and thus to a non-rounded shape of the respective solder balls, thereby compromising the co-planarity and bump height distribution within a respective die region and across the entire substrate 101. Any significant non-uniformity of the height of the solder balls may result in a reduced contact to the corresponding contact pad of the carrier substrate or a solder ball of reduced height may even fail to form a contact with the respective contact pad.

Consequently, the cleaning process 110 is designed to effectively remove or at least significantly reduce the number of the particles 109. For this purpose, in one illustrative embodiment, the cleaning process 110 may comprise one or more sub-steps performed during or at the end of the patterning process 107 as an in situ cleaning procedure. For example, in illustrative embodiments, the patterning process 107 is designed as an electrochemical etch process and the patterning process 107 may then correspondingly be modified to include a fast sweep across the substrate surface by respective means, as are typically provided in conventional electroplating and electroetching tools, such as brushes and the like. The fast sweep operation may be performed while the current of the electrochemical etch process for removing material of the first layer 105a is maintained. Moreover, one or more sweep operations may be performed with the current flow being discontinued, thereby also efficiently removing the particles 109 that may have been deposited between adjacent solder bumps 106. In one illustrative embodiment, additionally or alternatively, at least one further cleaning step is performed in which de-ionized water is directed under an appropriately high pressure onto the device 100 to further enhance the efficiency of the cleaning process 110. It should be appreciated that any other cleaning steps, such as brushing or sweeping over the exposed surface of the device 100 in the presence of any appropriate liquid, such as de-ionized water and the like, may be used. Moreover, applying de-ionized water may be performed by means of any appropriate device incorporating an appropriately designed arrangement of jets so as to loosen and/or remove the particles 109 in a highly efficient manner. In one illustrative embodiment, the cleaning process 110 may comprise one or more cleaning steps that may be performed in situ with the patterning process 107, such as the sweep operations with and without current, and may also comprise one or more further cleaning steps, such as the high pressure de-ionized water procedure, that may be performed in a separate process tool.

Figure 1C:
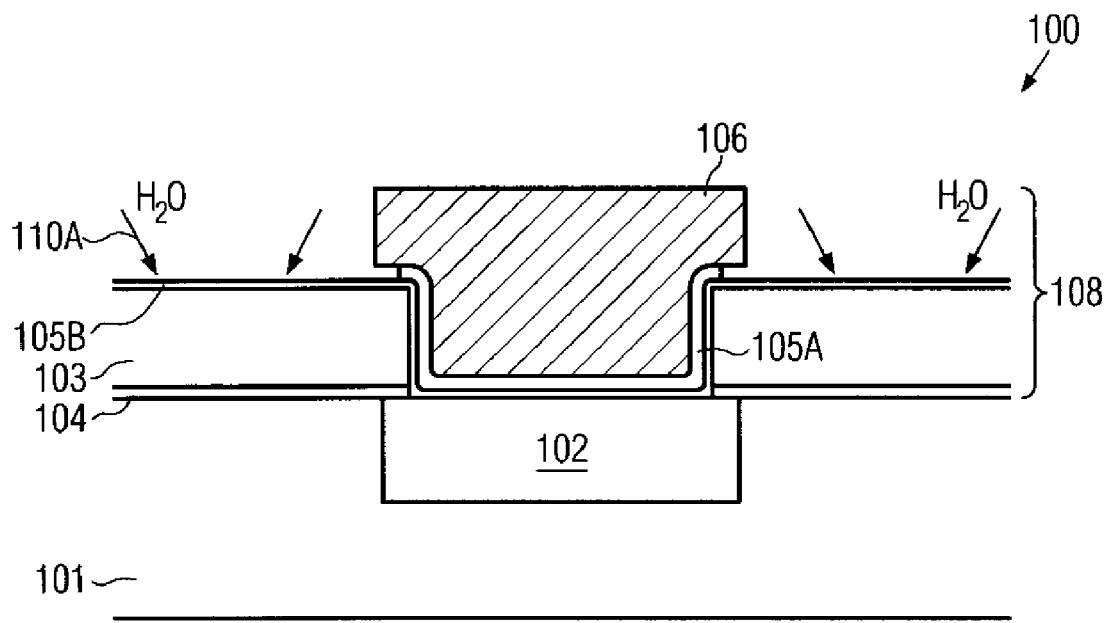

FIG. 1c schematically shows the semiconductor device 100 during such a separate cleaning step of the cleaning process 110, during which de-ionized water is supplied to exposed surface portions of the device 100. In this manufacturing stage, a high pressure de-ionized water rinse procedure 10a is performed, so that, in combination with any preceding cleaning steps that may have optionally been performed, for instance during the preceding patterning process 107, the particles 109 are substantially removed, thereby preparing the device 100 for the plasma-based patterning process of the second layer 105b.

Figure 1D:
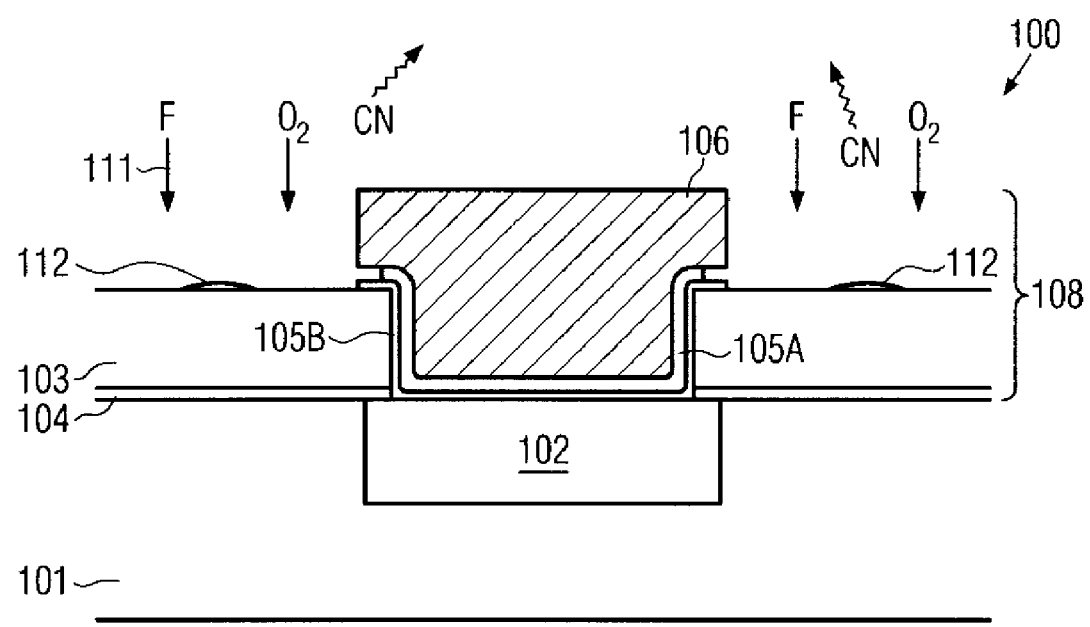

FIG. 1d schematically shows the semiconductor device 100 in a further advanced manufacturing stage, i.e., during the patterning of the second layer 105b. In this manufacturing stage, the device 100 is subjected to a dry etch process 111 that is configured to effectively remove material of the second layer 105b, which in one illustrative embodiment is comprised of titanium and tungsten, while in other embodiments other material compositions may be used as are specified above. The plasma-based etch process 111 may be performed on the basis of a fluorine-containing chemistry, wherein precursor gases, such as $SF_6$, $CF_4$, $CHF_3$, $NF_3$, and the like, may be used to provide the respective chemical component of the etch process 111 for reacting with the material of the second layer 105b. In one illustrative embodiment, the etch ambient of the process 111 is established to also comprise a physical component, i.e., a component that interacts with the material of the layer 105b and/or any byproducts of the chemical reaction with the fluorine-based chemistry substantially by ion bombardment and sputter effects, thereby substantially avoiding any self-passivation of the second layer 105b, which may occur if only the chemical component, i.e. the fluorine-based chemistry, is used in the patterning process 111. In one illustrative embodiment, oxygen is added to the reactive fluorine-based atmosphere to provide the physical component of the patterning process 111. For example, a suitable ambient for the patterning process 111 may be established in any appropriate conventional etch tool using oxygen and fluorine-based precursors, such as one of the gases identified above, with flow rates of approximately 50-200 sccm and 100-300 sccm, respectively, with a carrier gas such as hydrogen, nitrogen and the like, with a flow rate of approximately 700-1500 sccm. Hereby, a radio frequency power of approximately 300-2000 W for a standard process chamber design may be used wherein a temperature of the substrate 101 may be maintained at approximately 100-300° C. and a total pressure of the etch ambient may be in the range of approximately 0.1-5.0 Torr. However, other process parameters may be established, depending on the specific material composition of the second layer 105b, on the basis of the above teaching.

It should be appreciated that the plasma-based patterning process 111 is significantly less dependent on the pattern density and the geometrical arrangement of the solder bumps 109 compared to conventional wet chemical processes for patterning the second layer 105b. Consequently, a high degree of across-substrate uniformity of the process 111 in removing the layer 105b is obtained, thereby relaxing any constraints with respect to the design of the contact layer 108 and with respect to the arrangement, i.e., the distance in the x and y direction of entire die regions formed on the substrate 101, as will be explained in more detail with reference to FIG. 1g. Moreover, due to the moderately high directionality of the plasma-based patterning process 111, a high etch fidelity is obtained and the second layer 105b is patterned to substantially correspond to the solder bump 109, which acts as an etch mask thereby avoiding undue under-etching of the solder bump 109. Additionally, the patterning process 111 exhibits a significantly reduced removal rate for material of the solder bump 109, as is previously indicated with reference to the cleaning process 110, since the fluorine-based chemistry may not efficiently remove lead and tin based solder material. Consequently, the height uniformity of the solder bumps 106 after reflow may be enhanced compared to conventional techniques, thereby improving reliability and production yield of the devices 100.

At the final phase of the patterning process 111, the passivation layer 103 is increasingly exposed, wherein byproducts released from the passivation layer 103 may increasingly be encountered in the deposition atmosphere of the process 111. In one illustrative embodiment, the passivation layer 103 may be comprised of polyimide, which may result in the production of volatile components, such as cyanide (CN) which may be used as an effective endpoint detection indicator as excited cyanide molecules have a pronounced emission wavelength at 386/388 nm. These wavelengths may efficiently be detected and monitored by an optical endpoint detection system (not shown) as is typically provided in conventional etch tools. Consequently, the patterning process 111 may be stopped on the basis of an endpoint detection signal obtained from cyanide molecules, thereby substantially avoiding any undue material removal from the passivation layer 103. In other embodiments, a different material, such as benzocyclobutene may be used for the passivation layer 103, so that other optical wavelengths may be identified for an appropriate endpoint detection signal. Corresponding optical endpoint detection signals may be identified on the basis of test runs, wherein one or more material layers may be etched by the process 111 and a certain bandwidth of optical signals, which may include infrared and ultraviolet wavelengths, may be monitored so as to identify therefrom one or more appropriate individual wavelengths or to identify an appropriate wavelength range. In other embodiments, a specific wavelength region, such as a region from approximately 500-800 nm, may be monitored during the process 111 wherein a significant drop of intensity in this wavelength interval may indicate the increasing exposure of the passivation layer 103. In other cases, pronounced lines within the above-specified wavelength range may be identified and may be tracked so as to reliably detect a significant drop of intensity, which may then be used to determine an appropriate end of the patterning process 111.

Figure 1E:
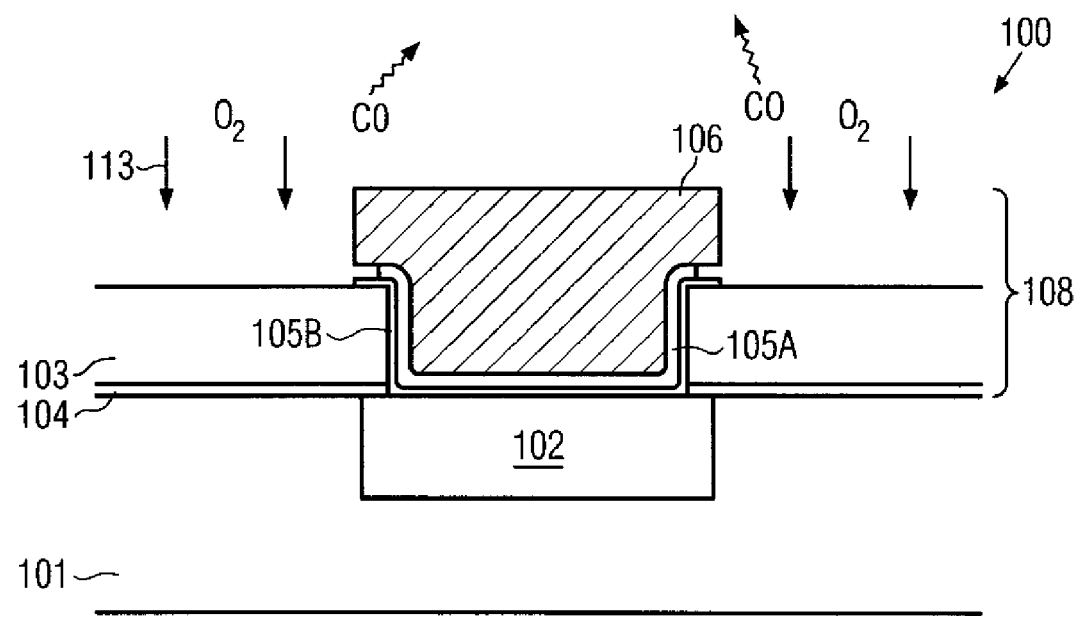

As indicated in FIG. 1d, during and after the process 111, a layer or areas of carbon haze 112 may form on exposed portions of the passivation layer 103. FIG. 1e schematically shows the semiconductor device 100 during a plasma treatment 113 for removing the carbon haze 112. The plasma treatment 113 may be designed as an oxygen-based plasma treatment, which may be based on process recipes employed in conventional process flows for removing carbon haze after the wet chemical patterning of a titanium tungsten under-bump metallization layer. In one illustrative embodiment, the plasma treatment 113 may be combined with the patterning process 111 so that these two process steps may be performed in situ, wherein, after detecting and determining the endpoint of the patterning process 111, the corresponding etch ambient is modified so as to represent the ambient of the plasma treatment 113. That is, after the endpoint of the patterning process 111 is determined, the supply of those precursor gases that are no longer required may be discontinued, while other gases such as oxygen and any carrier gases are provided along with an appropriate radio frequency power. Moreover, other process parameters, such as substrate temperature, pressure and the like, may be adjusted to reliably remove the carbon haze 112 while avoiding undue material removal at the solder bump 106 and the passivation layer 103. For this purpose, in one illustrative embodiment, a further endpoint detection procedure may be introduced to reliably identify an appropriate point for discontinuing the plasma treatment 113. For instance, one or more pronounced emission wavelengths of carbon monoxide or carbon dioxide may be used to identify the end of the plasma treatment 113. For instance, carbon oxide may be formed during an oxygen plasma treatment, as long as carbon haze is effectively removed from exposed portions of the device 100. After a significant drop of the intensity of one or more specific wavelengths, an appropriate point in time may be selected for terminating the plasma treatment 113. However, in other cases, other volatile materials may be identified, which may allow an efficient optical endpoint detection of the plasma treatment 113. For example, other volatile byproducts generated during the bombardment with oxygen or any other species for effectively removing the carbon haze 112 may be identified on the basis of a corresponding emission line, which may then be used as an appropriate endpoint detection signal. Corresponding endpoint detection signals may be identified on the basis of test runs that may be performed with different materials for the passivation layer 103 and/or for different process conditions of the plasma treatment 113.

Figure 1F:
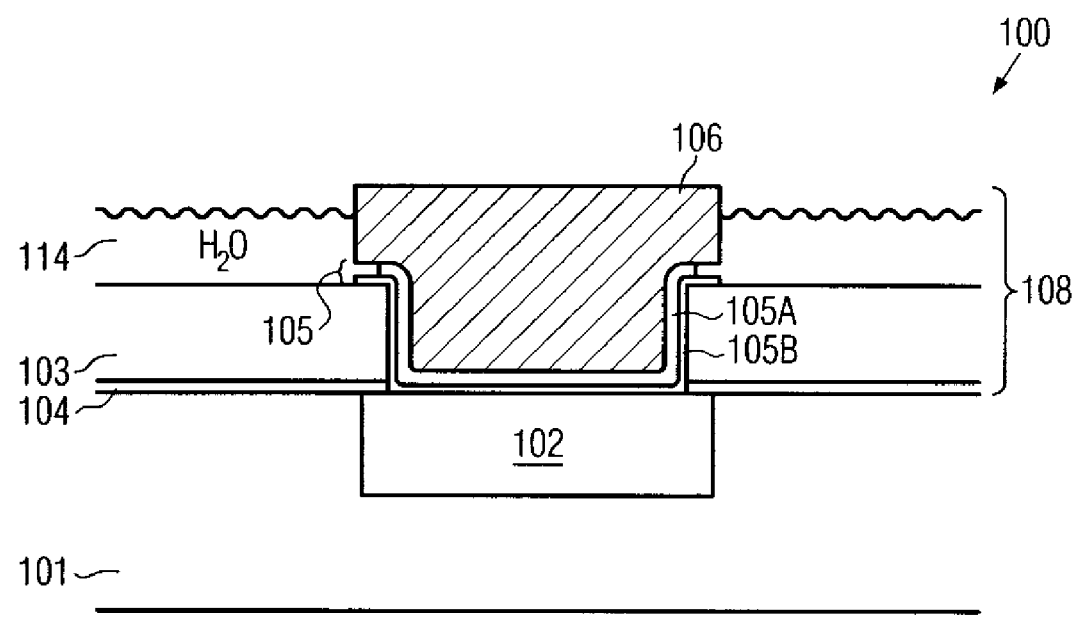

In FIG. 1f, the semiconductor device 100 is shown in a further advanced manufacturing stage. Here, the device 100 is subjected to a further cleaning process 114, which is designed to remove residues from the preceding patterning process 111 performed with a fluorine-based chemistry. For this purpose, the device 100 may be purged with an appropriate wet chemical chemistry, such as diluted acid and the like, wherein the process 114 may be performed in one illustrative embodiment as an in situ process in a wet strip process chamber of any appropriate conventional process tool, while in other embodiments a corresponding process sequence may be performed in a spray or immersion tool for applying one or more appropriate chemicals, wherein one or more rinsing processes may be performed.

Thereafter, further processing may be continued in a conventional manner, that is, if required, the solder bump 106 may be formed into a solder ball by reflowing the solder material, wherein the material of the solder bump 106 may retract by surface tension on the first layer 105a, which may also form a compound or alloy with the reflowed solder material. Since the preceding patterning process, that is, in particular the plasma-based patterning process 111, exhibits a significantly reduced removal rate for the material of the solder bump 106, the production cost may significantly be reduced, especially when highly expensive radiation reduced lead is used, while on the other hand an improved height uniformity of the resulting solder bumps may be accomplished.

Figure 1G:
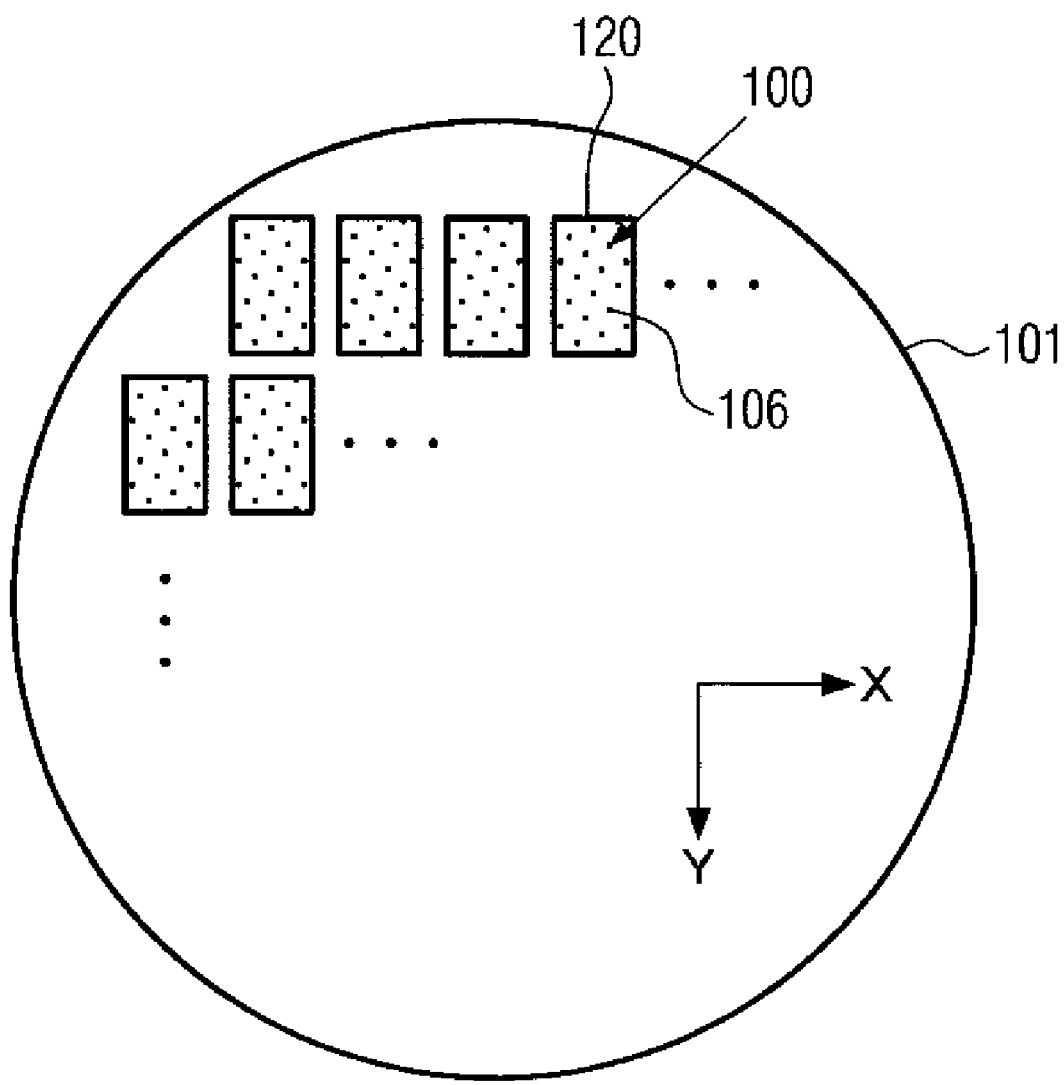
FIG. 1g schematically shows a top view of a substrate having formed thereon a plurality of dies, each of which comprises a plurality of solder bumps arranged in accordance with device-specific requirements due to the enhanced design flexibility provided by the patterning process on the basis of a dry etch process in accordance with illustrative embodiments of the present invention.

FIG. 1g schematically shows a top view of the substrate 101, which comprises a plurality of dies 120, each of which may include one or more semiconductor devices 100, the formation of which is described with reference to FIGS. 1a-1f. Thus, the die regions 120, arranged in a grid-like array and registered in the x-direction and y-direction having corresponding distances between neighboring die regions 120, each comprise a plurality of solder bumps 106. The plurality of solder bumps 106 may be distributed on each of the die regions 120 in accordance with device-specific requirements rather than any constraints imposed by a wet chemical patterning process, as is the case in the conventional technique described above. As previously explained, the plasma-based patterning process 113 is substantially independent from the type of pattern used for the arrangement of the plurality of solder bumps 106 and is substantially independent from the specific size and shape of the solder bumps 106. Consequently, the arrangement of the plurality of solder bumps 106 may be selected on the basis of constraints with respect to electrical, thermal and mechanical considerations so that enhanced flexibility is obtained for designing the configuration of the contact layer 108. Therefore, an enhanced device performance may be obtained in addition to enhanced design flexibility since the designer may arrange the solder bumps such that, for instance, routing out of signals may be improved and/or heat dissipation at portions high switching activity is enhanced by providing an increased density of solder bumps, and the like. Moreover, a distance between individual die regions 120 in the x- and y-direction may be selected on the basis of other device and process requirements, thereby possibly enabling increasing the number of dies per substrate.

As a result, the present invention provides an improved technique for patterning an underbump metallization layer stack wherein at least the layer contacting the passivation layer is patterned by a dry etch process, thereby avoiding many of the problems involved in the highly complex wet chemical etch processes for patterning the corresponding underbump metallization layer. In illustrative embodiments, this layer is frequently provided as a titanium tungsten layer, which may require a highly complex wet chemical etch process resulting in increased production costs and moderate yield due to etch residues, such as a detached titanium tungsten ring as a result of the conventional wet chemical etch process, which in turn may result in a reduced solder ball height uniformity. The plasma-based patterning process for the last underbump metallization layer exhibits a significantly reduced dependency on pattern density and bump size, thereby allowing an enhanced design flexibility so as to more efficiently take into consideration device-specific requirements, such as electrical, thermal and mechanical characteristics of the solder bumps. On the other hand, any area dependent effects of the plasma-based etch process, such as the amount of exposed titanium/tungsten material or any other material of the last underbump metallization layer, may readily be taken into consideration by correspondingly adapting the plasma-based etch recipe, for instance by correspondingly adapting the overall process time, wherein highly efficient endpoint detection procedures may be used to reliably terminate the plasma-based patterning process. Thus, significant cost savings may be obtained with respect to chemicals that are conventionally needed for a highly complex wet chemical etch process combined with reduced efforts in view of analytical procedures that are usually involved in controlling and monitoring the conventional etch processes. Moreover, generally a reduced process time is obtained by using the plasma-based patterning process. Furthermore, solder bumps in general may be formed more precisely due to a reduction of etch rate variations that in conventional techniques may depend on the bump configuration and bump size, thereby finally resulting in a more controlled adhesion of the solder balls with respect to the die. Moreover, since the plasma-based patterning process is substantially independent of the bump size, arrangement and the bump pitch, further device scaling may be accomplished wherein the bump pitch as well as the bump size may be reduced so as to be appropriate for future device generations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    patterning a first layer of an underbump metallization layer stack by an electrochemical etch process in the presence of a plurality of bumps formed on said underbump metallization layer stack to expose at least a portion of a second layer of said underbump metallization layer;
    cleaning said exposed portion of said underbump metallization layer to remove at least one byproduct of said electrochemical etch process by performing a first sweep operation while maintaining a current flow used during said electrochemical etch process and performing a second sweep operation with said current flow discontinued; and
    patterning said second layer of said underbump metallization layer stack by a dry etch process after said cleaning.

2. The method of claim 1, wherein cleaning said second layer comprises removing particles from said second layer.

3. The method of claim 1, wherein said cleaning further comprises performing a wet clean process after said second sweep operation.

4. The method of claim 1, wherein patterning said second layer comprises establishing a plasma ambient comprising a chemically reactive component and a physical component for bombarding said second layer.

5. The method of claim 1, further comprising performing a plasma cleaning process after patterning said second layer for removing carbon residues from a passivation layer underlying said underbump metallization layer stack.

6. The method of claim 1, further comprising performing a final wet chemical cleaning process for removing byproducts of the preceding dry etching process.

7. The method of claim 1, wherein said second layer is comprised of titanium and tungsten.

8. The method of claim 1, wherein said second layer comprises at least one of titanium, tantalum, tungsten, alloys thereof, nitrogen compounds thereof, silicon compounds thereof and nitrogen/silicon compounds thereof.

9. The method of claim 1, wherein said first layer comprises at least one of copper and chromium.

10. The method of claim 1, further comprising optically detecting an endpoint of said dry etch process.

11. The method of claim 4, wherein said plasma ambient comprises fluorine and oxygen as a chemically reactive and a physical component, respectively.

12. The method of claim 5, wherein said plasma cleaning process is performed in situ with said dry etch process for patterning said second layer.

13. The method of claim 5, further comprising optically detecting an endpoint of said plasma cleaning process.

14. The method of claim 10, further comprising determining an appropriate monitor wavelength of at least one volatile component formed by etching into an underlying passivation layer.

15. A method, comprising:
    providing a substrate having formed thereon an underbump metallization layer stack with at least a first layer and a second layer and a plurality of bumps formed above said underbump metallization layer stack;
    patterning said first layer of said underbump metallization layer stack to expose at least a portion of said second layer;
    cleaning said exposed portion of second layer to remove at least one byproduct of said patterning by performing a first sweep operation while maintaining a current flow used during said patterning of said first layer and performing a second sweep operation with said current flow discontinued; and
    dry etching said exposed second layer while using said bumps as an etch mask.

16. The method of claim 15, wherein patterning said first layer comprises etching said first layer by an electrochemical etch process.

17. The method of claim 15, wherein cleaning said second layer comprises removing particles from said second layer.

18. The method of claim 15, wherein said cleaning further comprises performing a wet clean process after said second sweep operation.

19. The method of claim 15, wherein patterning said second layer comprises establishing a plasma ambient comprising a chemically reactive component and a physical component for bombarding said second layer.

20. The method of claim 15, further comprising performing a plasma cleaning process after dry etching said second layer for removing carbon residues from a passivation layer underlying said underbump metallization layer stack.

21. The method of claim 15, further comprising performing a final wet chemical cleaning process for removing byproducts of the preceding dry etching process.

22. The method of claim 15, wherein said second layer is comprised of titanium and tungsten.

23. The method of claim 15, wherein said second layer comprises at least one of titanium, tantalum, tungsten, alloys thereof, nitrogen compounds thereof, silicon compounds thereof and nitrogen/silicon compounds thereof.

24. The method of claim 15, wherein said first layer comprises at least one of copper and chromium.

25. The method of claim 15, further comprising optically detecting an endpoint during dry etching said second layer.

26. The method of claim 19, wherein said plasma ambient comprises fluorine and oxygen as a chemically reactive and a physical component, respectively.

27. The method of claim 20, wherein said plasma cleaning process is performed in situ with dry etch of said second layer.

28. The method of claim 27, further comprising optically detecting an endpoint of said plasma cleaning process.

29. The method of claim 25, further comprising determining an appropriate monitor wavelength of at least one volatile component formed by etching into an underlying passivation layer.

* * * * *